United States Patent
Frank et al.

(10) Patent No.: US 9,960,679 B2
(45) Date of Patent: May 1, 2018

(54) CONTROLLING A PAIR OF SWITCHES

(71) Applicant: Infineon Technologies Austria AG, Villach (AT)

(72) Inventors: Wolfgang Frank, Augsburg (DE); Remigiusz Viktor Boguszewicz, Essen (DE)

(73) Assignee: Infineon Technologies Austria AG, Villach (AT)

( * ) Notice: Subject to any disclaimer, the term of this patent is extended or adjusted under 35 U.S.C. 154(b) by 781 days.

(21) Appl. No.: 14/294,941

(22) Filed: Jun. 3, 2014

(65) Prior Publication Data

US 2015/0349632 A1 Dec. 3, 2015

(51) Int. Cl.
| | |
|---|---|
| *H02M 1/44* | (2007.01) |
| *H02M 3/157* | (2006.01) |
| *H02M 1/08* | (2006.01) |
| *H02M 1/38* | (2007.01) |
| *H03K 17/082* | (2006.01) |
| *H03K 17/16* | (2006.01) |
| *H02M 3/158* | (2006.01) |
| *H02M 1/00* | (2006.01) |

(52) U.S. Cl.
CPC .............. *H02M 3/157* (2013.01); *H02M 1/08* (2013.01); *H02M 1/38* (2013.01); *H03K 17/0828* (2013.01); *H03K 17/165* (2013.01); *H03K 17/168* (2013.01); *H02M 3/1588* (2013.01); *H02M 2001/0009* (2013.01); *Y02B 70/1466* (2013.01)

(58) Field of Classification Search
CPC ...................................................... H02M 1/44
See application file for complete search history.

(56) References Cited

U.S. PATENT DOCUMENTS

| | | | |
|---|---|---|---|
| 4,953,070 A | 8/1990 | Lenz | |
| 6,678,180 B2 | 1/2004 | Matsuda | |
| 6,897,682 B2 * | 5/2005 | Nadd | H02M 1/088 326/27 |
| 7,382,116 B2 * | 6/2008 | Endo | G05F 1/618 323/223 |
| 7,482,655 B2 | 1/2009 | Nadd | |
| 7,492,133 B2 * | 2/2009 | Yoshikawa | H02M 1/38 323/222 |
| 8,773,172 B2 | 7/2014 | Bayerer | |
| 2003/0231011 A1 | 12/2003 | Umemoto et al. | |

(Continued)

FOREIGN PATENT DOCUMENTS

| | | |
|---|---|---|
| CN | 2492034 Y | 5/2002 |
| CN | 2517098 Y | 10/2002 |

(Continued)

OTHER PUBLICATIONS

Maderbacher, G. et al., "Automatic Dead Time Optimization in a High Frequency DC-DC Buck Converter in 65 nm CMOS," Proceedings of the 37th European Solid-State Circuits Conference, ESSCIRC 2011, Sep. 12-16, 2011, 4 pp.

(Continued)

*Primary Examiner* — Hai L Nguyen
(74) *Attorney, Agent, or Firm* — Shumaker & Sieffert, P.A.

(57) ABSTRACT

Devices and methods are provided where a feedback is provided from a control terminal of a first switch, and a second switch is controlled based on the feedback.

10 Claims, 3 Drawing Sheets

(56) References Cited

U.S. PATENT DOCUMENTS

| | | |
|---|---|---|
| 2006/0087300 A1 | 4/2006 | Endo et al. |
| 2007/0063678 A1 | 3/2007 | Yoshikawa |
| 2011/0115651 A1 | 5/2011 | Zhou |
| 2013/0063984 A1 | 3/2013 | Sandner et al. |
| 2014/0063883 A1 | 3/2014 | Familiant et al. |

FOREIGN PATENT DOCUMENTS

| | | |
|---|---|---|
| CN | 100536301 A | 5/2006 |
| CN | 103825461 A | 5/2014 |
| DE | 10200332 A1 | 7/2002 |
| DE | 10325588 A1 | 12/2003 |
| DE | 10343278 A1 | 4/2005 |

OTHER PUBLICATIONS

Mappus, S., "Predictive Gate Drive Boosts Synchronous DC/DC Power Converter Efficiency," Texas Instruments Literature, Application Report SLUA281, Apr. 2003, 26 pp.

Rose, M. et al., "Effects of Varying Load Conditions on Adaptive Gate Control Methods," Proceedings of the 14th European Conference on Power Electronics and Applications (EPE 2011), Aug. 30-Sep. 1, 2011, 7 pp.

Office Action, in the Chinese, from counterpart Chinese Application No. 102014114499.6, dated Sep. 6, 2017, 12 pp.

Office Action, in the German language, from counterpart German Application No. 102015108363.9, dated Feb. 20, 2018, 8 pp.

\* cited by examiner

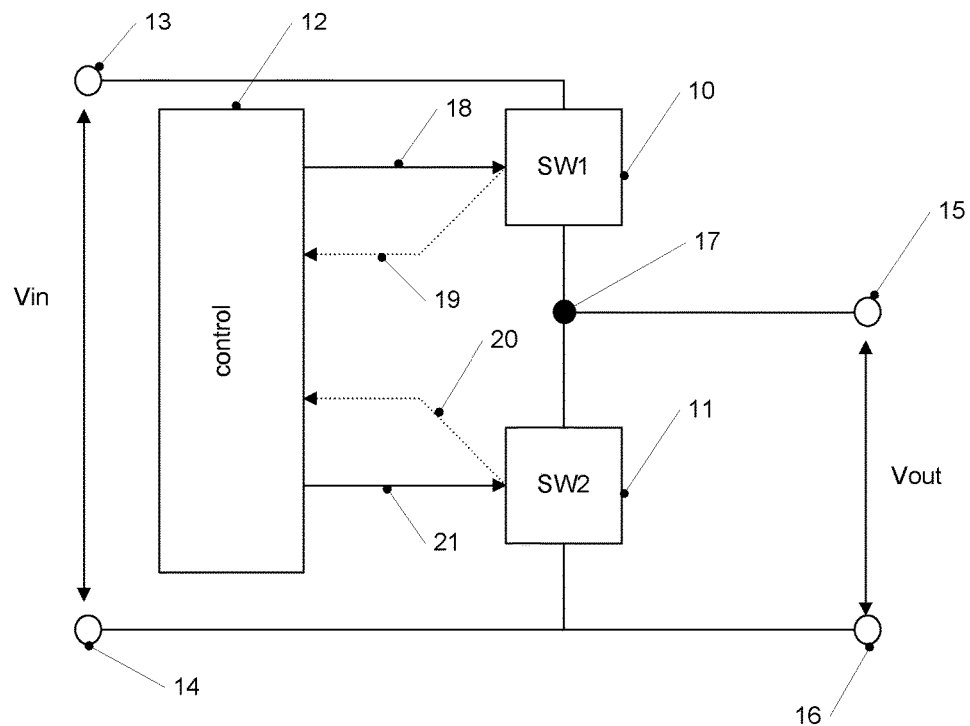
Fig. 1
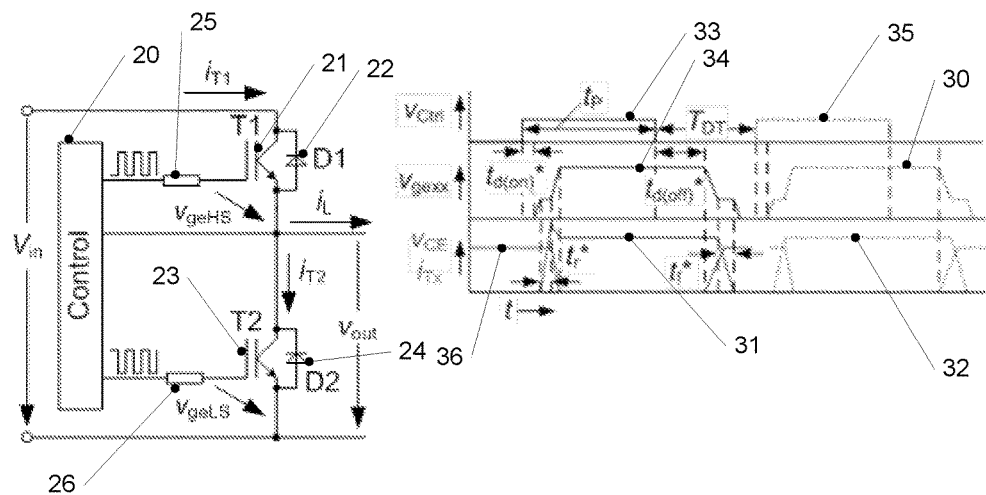
Fig. 2
Fig. 3

CONTROLLING A PAIR OF SWITCHES

TECHNICAL FIELD

The present application relates to apparatuses, devices, methods and systems related to controlling a pair of switches.

BACKGROUND

In half-bridge circuits used, e.g., in some of voltage converters, like DC/DC converters, a pair of switches may be controlled to perform a conversion. Examples for such converters are for example so-called buck converters or buck-boost converters. The switches, which may be for example transistors, may be controlled in a way that when a first switch of the pair of switches is conducting, a second switch of the pair of switches is non-conducting and vice versa. In other words, for some applications, it has to be ensured that both switches of the pair of switches are never conducting at the same time.

For example, in some cases, if both first and second switches were conducting at the same time, a short circuit condition could result.

Therefore, in conventional systems, some time passes after one of the first and second switches is opened (i.e., becomes non-conducting) before the other one of the first and second switches is closed (i.e., becomes conducting). This time is also referred to as dead time and constitutes a kind of safety margin. However, a large dead time may restrict controllability of a converter where the switches are employed or may be undesirable for other reasons, for example, if a fast switching is desired.

BRIEF DESCRIPTION OF THE DRAWINGS

FIG. 1 is a block diagram of a device according to an embodiment.

FIG. 2 is a schematic circuit diagram illustrating a half-bridge circuit.

FIG. 3 is a diagram illustrating signals in the circuit of FIG. 2.

DETAILED DESCRIPTION

Figure 4:
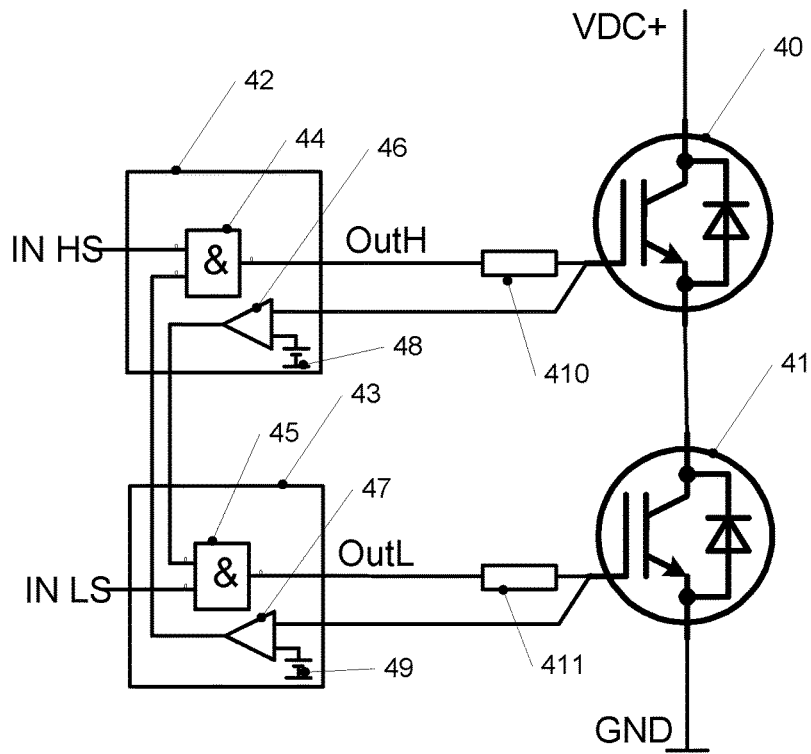
FIG. 4 is a circuit diagram illustrating a device according to an embodiment.

In the following, various embodiments will be described in detail referring to the attached drawings. These embodiments are given by way of example only and are not to be construed as limiting the scope of the present application.

For example, while embodiments may be described as comprising a plurality of features or elements, in other embodiments, some of these features or elements may be omitted, and/or replaced by alternative features or elements. In yet other embodiments, additionally or alternatively, further features or elements apart from the ones explicitly described may be provided.

Features or elements from different embodiments may be combined with each other, unless specifically noted otherwise.

In the following embodiments, connections or couplings between elements, blocks or devices may be direct connections or couplings, i.e., connections or couplings without intervening elements or indirect connections or couplings, i.e., connections or couplings with one or more intervening elements, unless specifically noted otherwise, as long as the general function of the connection or coupling, for example to transmit a certain kind of signal or information, is basically maintained. Connections or couplings may be wire-based connections or couplings or wireless connections or couplings.

Some of the following embodiments use switches. Switches may be described as having two load terminals and a control terminal. A state of the switch may, for example, be opened or closed, and the state may be controlled by a signal applied to the control terminal. In a closed state (sometimes also referred to as on-state), the switch may be conducting between its load terminals, i.e., have a low ohmic resistance between its load terminals, and in an open state (sometimes also referred to as off-state) the switch may be non-conducting, i.e., have a high ohmic resistance between its load terminals. It should be noted that in the open state, in some implementations, still very small currents may flow, for example unintended leakage currents.

In some embodiments, switches may be implemented using transistors, for example bipolar transistors, field-effect transistors or insulated gate bipolar transistors which in some respect are a mixture of bipolar and field-effect transistors. In this case, for example, a gate terminal or a base terminal may correspond to a control terminal of the switch, and source and drain terminals or emitter and collector terminals may correspond to load terminals.

In some embodiments, a control signal at a control input of a first switch of a pair of switches may be monitored, and a second switch of the pair of switches may be controlled based on the monitoring. The control signal at the control input, in some embodiments, may be a voltage signal, and the controlling of the second switch may, for example, comprise closing the switch only if the voltage at the control input of the first switch crosses a predetermined threshold indicating that the first switch is opened. In some embodiments, in this way a dead time between opening the first switch and closing the second switch may be reduced.

Turning now to the figures, in FIG. 1, a block diagram of a device according to an embodiment is shown. The device of FIG. 1, for example, receives an input voltage Vin at terminals 13, 14 and outputs an output voltage Vout between terminals 15 and 16. In some embodiments, the device of FIG. 1 may act as a voltage converter converting an input. However, techniques discussed below with respect to operation of switches 10, 11 may also be applicable to other devices than voltage converters.

As illustrated, the device of FIG. 1 comprises a first switch 10 and a second switch 11, which are controlled by a controller 12 in the embodiment illustrated in FIG. 1. A first load terminal of first switch 10 is coupled to terminal 13. A second load terminal of first switch 10 is coupled with a first load terminal of second switch 11. A second load terminal of second switch 11 is coupled with terminals 14 and 16. A node 17 between first switch 10 and second switch 11 is coupled with terminal 15.

A switching of switch 10 is controlled by controller 12 via a control terminal of first switch 10, as indicated by an arrow 18. A switching of second switch 11 is controlled by controller 12 via a control terminal of second switch 11, as indicated by an arrow 21. Switches 10, 11 in some embodiments may be implemented using transistors. In other embodiments, switches 10, 11 may for example comprise a combination of a transistor and a diode. Generally, the switches described and controlled with the techniques of this disclosure are not necessarily limited to any particular type. The switches described and controlled with the techniques of this disclosure may include switches formed in Silicon (Si), Gallium Nitride (GaN), Silicon Carbide (SiC), and/or other materials. The switches may be normally-on type switches, or normally-off type switches. As more specific examples, the switches may comprise GaN high-electron-mobility transistors (HEMT), N-type MOSFET based switch devices, P-type MOSFET based switch devices, insulated gate bipolar transistor (IGBT) switch devices, bipolar transistor switch devices and/or drain extended MOS (deMOS) switch devices. Furthermore, the switches may comprise any other type of power switch transistors or switch device that can operate in a power stage configuration at a CMOS type die.

In an embodiment, controller 12 controls first switch 10 and second switch 11 such that switches 10, 11 may be closed and opened in an alternating manner, while preventing that first switch 10 and second switch 11 are closed at the same time, which would short circuit terminals 13 and 14. To assist this, as indicated by a dotted arrow 19, controller 12 receives feedback information regarding a signal at the control terminal of first switch 10, for example a signal level at the control terminal of first switch 10. Likewise, as indicated by a dotted arrow 20, controller 12 receives feedback information regarding a signal at the control terminal of second switch 11, for example, about a signal level at the control terminal of second switch 11. In other words, as indicated by dotted arrows 19, 20, controller 12 receives information regarding the actual signals, for example signal levels, present at the control terminals, which for example due to charging effects may be delayed compared to corresponding signals sent by controller 12.

In an embodiment, controller 12 may, for example, open second switch 11 as soon as the signal at the control terminal of first switch 10 indicates that first switch 10 is closed, and vice versa. In some embodiments, by directly evaluating the feedback information regarding the signals, for example signal levels, at the control terminals, dead times may be reduced. In other words, in some embodiments, a time between sending a signal to, for example first switch 10 to close first switch 10, and sending a signal to second switch 11 to open second switch 11, may be reduced in some cases.

In FIG. 2, a voltage converter is illustrated in which techniques disclosed herein, for example a controlling of switches as explained with reference to FIG. 1 may be implemented. The voltage converter of FIG. 2 comprises a first transistor 21 with a first diode 22 coupled between its load terminals, and a second transistor 23 with a second diode 24 coupled between its load terminals, as shown. Diodes 22, 24 may be intrinsic diodes of IGBTs 21, 23, respectively, or may be diodes which are provided in addition to transistors 21, 23. In the example shown, transistors 21, 23 are insulated gate bipolar transistors (IGBTs). In other embodiments, other kinds of transistors may be used. An input voltage Vin is applied between a collector terminal of first transistor 21 and an emitter terminal of second transistor 23. An output voltage $V_{out}$ may be tapped between the emitter terminal of second transistor 23 and a node coupled with an emitter terminal of first transistor 21 and a collector terminal of second transistor 23. A current flowing to first transistor 21 is labeled $i_{T1}$ in FIG. 2, a current flowing towards the collector terminal of second transistor 23 is labeled $i_{T2}$, and an output current from the above-mentioned node is labeled $i_L$.

Controller 20 applies a control voltage to first transistor 21 via a first resistor 25, and a control voltage to a gate terminal of second transistor 23 via a resistor 26. As schematically indicated, transistors 21 and 23 may be closed, i.e., switched to a conducting state between collector and emitter, in an alternating manner such that at each point in time at most one of the transistors 21, 23 is conducting. To reduce a dead time, techniques as discussed with reference to FIG. 1, may be employed. For example, the controlling by controller 20 may be performed on a basis of a measurement of gate voltages of transistors 21, 23.

It should be noted that the circuit of FIG. 2 may comprise further elements, like filter elements or storage elements, to reduce parasitic effects in some embodiments, should they occur.

In FIG. 3, example signals for the circuit of FIG. 2 are shown. These example signals are given only for further illustration purposes, and depending on the implementation, the signals may have other forms. In FIG. 3, dotted signals generally refer to signals related to second transistor 23, while solid lines relate to signals concerning first transistor 21.

A curve 33 illustrates a control voltage $V_{Ctrl}$ sent by controller 20 to a gate terminal of first transistor 21, and a curve 34 illustrates a corresponding control voltage sent to a gate terminal of second transistor 23. A pulse duration of the control voltages is labeled $t_P$. A ratio between the pulse durations may determine a magnitude of the output voltage Vout, e.g., relative to the input voltage Vin. $T_{DT}$ illustrates a dead time, which may be reduced in some embodiments applying the techniques disclosed with reference to FIG. 1.

A curve 34 illustrates a gate-emitter voltage for $V_{gexx}$ (xx representing transistor 21 or 23) of first transistor 21, and a curve 30 illustrates a gate emitter voltage of second transistor 23. As can be seen, the gate emitter voltage lags compared to the control signal. For example, there is a time difference $t_{d(on)}$ between a rising edge of pulse 33 and the gate emitter voltage according to curve 34 reaching a level sufficient to turn transistor 21 on, i.e., close the switch represented by transistor 21, and there is a time difference $t_{d(off)}$ between a falling edge of pulse 33 and the gate emitter voltage $V_{gexx}$ falling far enough for transistor 21 to turn off, i.e., the switch to open. A curve 31 shows a collector emitter voltage $V_{CE}$ for first transistor 21, and a curve 32 shows the collector emitter voltage for second transistor 23. A curve 36 illustrates the behavior of $i_{T1}$ of FIG. 2 for the example signals shown, and a curve 37 illustrates the behavior of $i_{T2}$ for the example signals shown.

In some embodiments, by employing techniques as discussed with reference to FIG. 1, for example, by monitoring the gate emitter voltage in the circuit FIG. 2, the dead time $T_{DT}$ may be reduced, for example, by starting pulse 35 immediately after curve 34 has reached a threshold value indicating that first transistor 21 is turned off. In other embodiments, other techniques may be employed.

In FIG. 4, a device according to a further embodiment is illustrated. The device of FIG. 4 comprises two switch devices 40, 41. In the embodiment of FIG. 4, each switch device comprises an IGBT and a diode coupled between source and drain terminals of the IGBT. Again, such diodes may be intrinsic diodes or additionally provided diodes.

A collector terminal of the IGBT of switch device 40 is coupled to a voltage VDC+, and an emitter terminal of the IGBT of second switch device 41 is coupled with ground (GND). A difference between VDC+ and GND may correspond to an input voltage for the device of FIG. 4. An output voltage may, for example, be tapped between a node 412, which is located between switch devices 40, 41, and GND.

Switch device 40 may be referred to as a high side switch device, and switch device 41 may be referred to as a low side switch device. Switch device 40 is controlled by a high side driver 42 based on a high side driver input IN HS. A signal output by high side driver 42 via a transistor 410 to a gate terminal of the IGBT of switch device 40 is labeled OutH in FIG. 4.

In a similar manner, switch device 41 is controlled by a low side driver 43 based on a low side input signal IN LS. An output signal OutL of low side driver 43 is applied to a gate terminal of the IGBT of switch device 41 via a resistor 411.

Signals IN HS, IN LS may, for example, be pulse signals intended to alternately close switch device 40 and switch device 41.

High side driver 42 and low side driver 43 may be comprised in a controller and may be implemented as a single circuit in some embodiments. In high side driver 42, the high side driver signal IN HS is fed to a first input of an AND-gate 44. A second input of AND-gate 44 is coupled with an output of a comparator 47 of low side driver 43. An output of AND-gate 44 corresponds to the already mentioned control signal OutH. A first input of comparator 47 is coupled to the gate terminal of the IGBT of switch device 41 between switch device 41 and resistor 411 is as shown. Therefore, comparator 47 receives a gate voltage of switch device 41. A second input of comparator 47 is coupled with a reference voltage 49, represented by a battery sign in FIG. 4. Reference voltage 49 may output a reference voltage corresponding to a threshold voltage of the IGBT of switch device 41. In this way, comparator 47 may detect when the gate voltage of the IGBT of switch device 49 falls below a threshold value, which may indicate that switch device 41 is turned off. In some implementations, such a threshold value may, for example, be about 2 V, although other values may also be used, depending on an implementation of switch device 41.

By using this structure with AND-gate 44, switch device 40 is closed only when signal IN HS indicates that switch device 40 is to be closed AND the gate voltage of the IGBT of switch device 41 indicates that switch device 41 is open.

In a similar manner, low side driver 43 comprises an AND-gate 45. A first input of AND-gate 45 receives the low side control signal IN LS. A second input of AND-gate 45 is coupled with an output of a comparator 46 of high side driver 42. A first input of comparator 46 receives a gate voltage of the IGBT of first switch device 40, tapped between resistor 410 and first switch device 40. A second input of comparator 46 is coupled to a reference voltage 48. As described for reference voltage 49, reference voltage 48 may correspond to a gate voltage where the IGBT of switch device 40 becomes non-conducting. For example, the threshold voltage may be of the order 2 V, although depending on the implementation of first switching device 40 other values may also be used.

By this configuration, through the use of comparator 46 and AND-gate 45, signal OutL controls second switch device 41 to close only when the output signal of comparator 46 indicates that switch device 40 is open (for example, the gate voltage has fallen far enough below the threshold voltage 48) AND signal IN LS indicates that second switch device 41 is to be closed.

In this way, in the embodiment of FIG. 4, in some implementations, signals IN HS, IN LS may be selected such that one of switch devices 40, 41 would be closed immediately after the other of switch devices 40, 41 would be opened. For example, falling edges of one of the signals IN HS, IN LS may correspond to rising edges of the other one of signals IN HS, IN LS and vice versa.

Through the use of comparators 46, 47 and AND-gates 44, 45 in the embodiment of FIG. 4, it may then be ensured that the actual closing occurs only after the other switch device is surely opened, i.e., the gate voltage has a value ensuring that the other switch device is open. In this way, in some embodiments, a dead time may be reduced.

In some embodiments, resistors 410, 411 may be provided in an integrated circuit together with switch devices 40, 41. In further embodiments, also drivers 42, 43 and/or further components may be provided in such an integrated circuit. Resistors 410, 411 decouple drivers 42, 43 from switch devices 40, 41 to some extent. In other embodiments where no resistors 410, 411 or other decoupling is provided, the gate voltage may be tapped at other locations.

Figure 5:
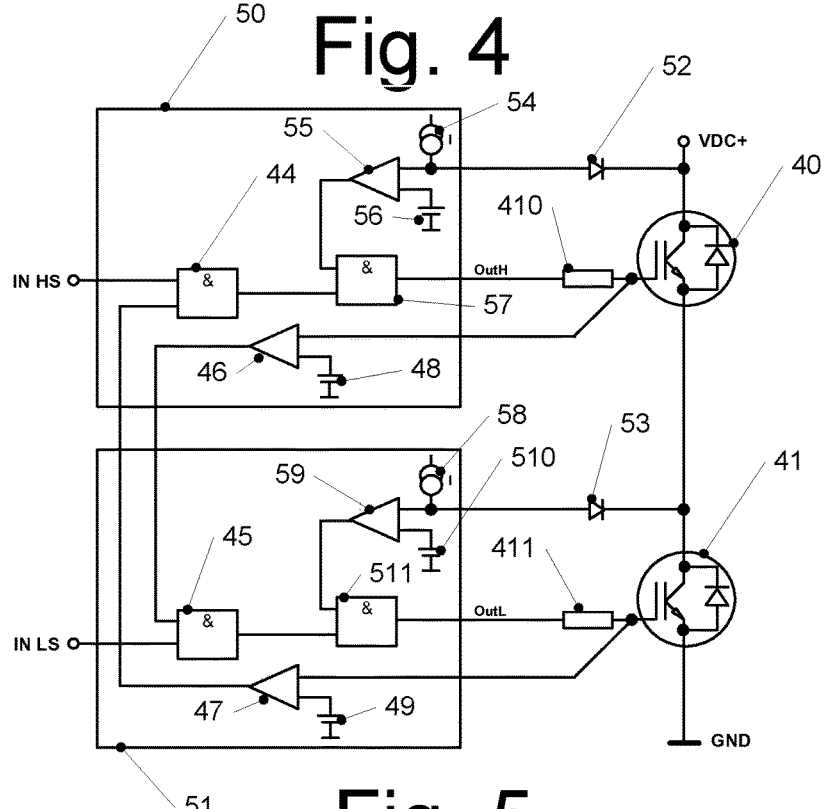
FIG. 5 is a circuit diagram illustrating a device according to an embodiment.

A further embodiment of a device is illustrated in FIG. 5. The embodiment of FIG. 5, to some extent, is based on the embodiment of FIG. 4. Elements of the embodiment of FIG. 5 which were already described with respect to FIG. 4, bare the same reference numerals and will not be described again in detail. For example, also the embodiment of FIG. 5 comprises first and second switching devices 40, 41, which are controlled via resistors 410, 411, respectively. Moreover, the embodiment of FIG. 5 comprises a high side driver 50 and a low side driver 51, which comprise also some elements already discussed with reference to FIG. 4, for example, AND-gates 44, 45, comparators 46, 47 and reference voltages 48, 49.

The embodiment of FIG. 5 furthermore comprises circuitry to detect a current direction through switch devices 40, 41. For example, when a current direction in one of the switch devices 40, 41 corresponds to the forward direction of the diode of the respective switch device 40, 41, the respective IGBT of the switch device may already be opened, as the diode carries the current. In embodiments, therefore, a switch device may be opened earlier than without the current detection, which in turn, in some embodiments, may enable an earlier closing of the other switch device, which, in some cases, may further reduce a dead time.

To achieve this, in the embodiment of FIG. 5, a first input of a comparator 55 is coupled with a collector terminal of the IGBT of first switching device 40 via a diode 52. The first input of comparator 55 is furthermore coupled with a current source 54. A second input of comparator 55 is coupled with a reference voltage 56 which, in some embodiments, may be about 0 V, but may vary according a respective implementation. An output of comparator 55 is coupled with a first input of an AND-gate 57. A second input of AND-gate 57 is coupled with the output of AND-gate 44. In the embodiment of FIG. 5, AND-gate 57 outputs control signal OutH to control first switching device 40. Via diode 52 and comparator 55, information regarding the current direction in first switching device 40 is obtained. When the current direction indicates that current is flowing via diode 40 (which may also be referred to as a negative current direction, for example, in the opposite direction than current $i_{T1}$ shown in FIG. 2), via AND-gate 57 comparator 55 opens switching device 40. A negative current therefore corresponds to a current opposite to a direction from VDC+ to ground (GND). This opening may be detected by comparator 46, which may enable an earlier closing of switching device 41.

In a similar manner, a first input of a comparator 59 is coupled with a collector terminal of the IGBT of second switching device 41 via a diode 53. Furthermore, the first input of comparator 59 is coupled with a current source 58.

A second input of comparator 59 may be coupled with a reference voltage 510, which, in some embodiments, may be about 0 V, although depending on the implementations, other values are also possible.

An output of comparator 59 is coupled with a first input of an AND-gate 511. A second input of AND-gate 511 is coupled with the output of AND-gate 45. Control signal OutL is provided by an output of AND-gate 511. Similar to what was described for first switching device 40, via diode 53 and comparator 59, in the embodiment of FIG. 5 it may be detected when current through second switching device 41 flows via the diode of second switching device 41, i.e., has a negative current direction (for example, in the opposite direction than indicated for $i_{T2}$ in FIG. 3). Via AND-gate 511 switching device 41 may then be opened (i.e., the IGBT may be opened), which does not affect the functioning as current may still flow via the diode. This opening may be detected via comparator 47 as already explained with reference to FIG. 4, which in turn may enable first switching device 40 to be opened earlier.

It should be noted that the embodiments serve only as examples, and other implementations are possible. For example, while a logic with two AND-gates 44, 57 in high side driver 50 and two AND-gates 55, 511 in low side driver 51 is illustrated, in other embodiments other logic gates may be used. For example, an AND-gate with three inputs may also be used.

Also, instead of IGBTs, depending on the currents of an implementation, other kinds of transistors, like field-effect transistors or bipolar transistors, may be used. Other modifications as apparent to skilled in the art may also be employed without departing from the scope of the application.

Figure 6:
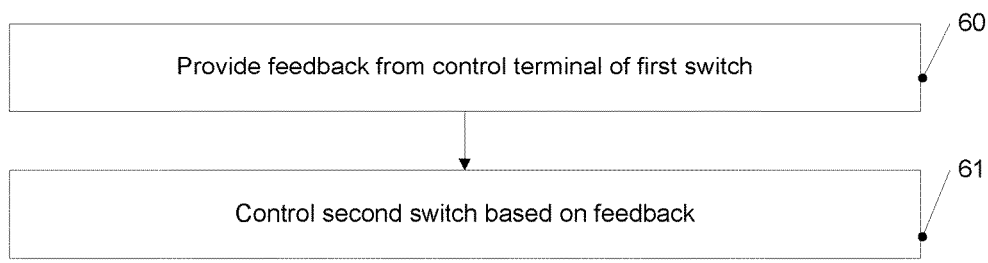
FIG. 6 is a flowchart illustrating a method according to an embodiment.

In FIG. 6, a flowchart illustrating a method according to an embodiment is illustrated. The method of FIG. 6 may be implemented in the devices illustrated and explained with reference to FIGS. 1 to 5, but may also be implemented in other devices, for example, other kinds of voltage converters.

While the method of FIG. 6 is illustrated as a series of acts or events, the order in which these acts or events are presented is not to be construed as limiting, as other embodiments may use other orders, and/or various acts or events may be performed in parallel, for example, by different parts of a circuit. The method may also be performed repetitively or continuously.

At 60 in FIG. 6, a feedback from a control terminal of a first switch is provided, which may indicate a signal present at the control terminal of the first switch, for example, a voltage level.

At 61, a second switch is controlled based on the feedback. For example, the second switch may be closed only if the feedback indicates that the first switch is opened. It should be noted that the method of FIG. 6 may additionally or alternatively also be applied with the roles of the first and second switch being reversed.

In other embodiments, other methods may be employed.

What is claimed is:

1. A device comprising:
   a first switch, the first switch comprising a first control terminal, a first load terminal, a second load terminal, a first transistor, and a first diode coupled between load terminals of the first transistor;
   a second switch, the second switch comprising a second control terminal, a third load terminal, a fourth load terminal, a second transistor, and a second diode coupled between load terminals of the second transistor; and
   a controller, wherein the controller is adapted to
      receive a first feedback regarding a first terminal signal at the first control terminal;
      output a first control signal to the second control terminal based on the first feedback; and
      detect when a current flows via the first diode, and to open the first switch when the current flows via the first diode.

2. The device of claim 1,
   wherein, to detect whether the current flows via the first diode, the controller comprises a further comparator, a first input of the further comparator being coupled with the first load terminal of the first switch,
   wherein a second input of the further comparator is coupled to a first reference signal,
   wherein the controller is further adapted to open the first switch based on an output of the further comparator.

3. The device of claim 2, wherein the first input of the further comparator is coupled to the first load terminal of the first switch via a further diode.

4. The device of claim 2, wherein the first input of the further comparator is coupled with a current source.

5. The device of claim 2, wherein the controller comprises a comparator, wherein a first input of the comparator is coupled with the second control terminal to receive a second feedback, wherein a second input of the comparator is coupled with a second reference signal.

6. The device of claim 5, wherein the controller further comprises at least one AND-gate, a first input of the at least one AND-gate being coupled with an output of the comparator, a second input of the at least one AND-gate being coupled with an output of the further comparator, and a third input of the at least one AND-gate being adapted to receive a first input signal, and an output of the AND-gate being coupled with the first control terminal.

7. A method, comprising:
   receiving, by a controller, a feedback regarding a first terminal signal at a control terminal of a first switch,
   controlling, by the controller, a second switch based on the feedback, wherein controlling the second switch comprises outputting a first control signal to a control terminal of the second switch based on the first feedback, and
   detecting, by the controller, when a current flows via a first diode, and to open the first switch when the current flows via the first diode coupled between load terminals of the first switch,
   wherein the controller is adapted to forward a second input signal as a second control signal closing the second switch only if the feedback indicates that the first switch is open.

8. The method of claim 7, wherein receiving the feedback comprises detecting a signal level at the control terminal of the first switch.

9. The method of claim 7, further comprising:
   receiving, by the controller, a further feedback from the control terminal of the second switch, and
   controlling, by the controller, the first switch based on the further feedback.

10. The method of claim 7, further comprising controlling the first switch and controlling the second switch to convert a first voltage to a second voltage.

\* \* \* \* \*